(12) United States Patent
Freire et al.

(10) Patent No.: US 12,237,792 B2
(45) Date of Patent: Feb. 25, 2025

(54) METHOD FOR DETERMINATION OF A LOCATION OF A SHORT CIRCUIT FAULT IN A GENERATOR ARRANGEMENT, GENERATOR ARRANGEMENT, WIND TURBINE, COMPUTER PROGRAM AND ELECTRONICALLY READABLE MEDIUM

(71) Applicant: Siemens Gamesa Renewable Energy A/S, Brande (DK)

(72) Inventors: Nuno Miguel Amaral Freire, Brande (DK); Rahul R Pillai, Ikast (DK); Zhan-Yuan Wu, Sheffield (GB)

(73) Assignee: Siemens Gamesa Renewable Energy A/S, Brande (DK)

(*) Notice: Subject to any disclaimer, the term of this patent is extended or adjusted under 35 U.S.C. 154(b) by 499 days.

(21) Appl. No.: 17/295,477

(22) PCT Filed: Dec. 20, 2019

(86) PCT No.: PCT/EP2019/086822
§ 371 (c)(1),
(2) Date: May 20, 2021

(87) PCT Pub. No.: WO2020/128058
PCT Pub. Date: Jun. 25, 2020

(65) Prior Publication Data
US 2022/0006414 A1    Jan. 6, 2022

(30) Foreign Application Priority Data
Dec. 21, 2018  (EP) .................................... 18215481

(51) Int. Cl.
*G01R 31/52*  (2020.01)
*G01R 31/34*  (2020.01)
(Continued)

(52) U.S. Cl.
CPC .......... *H02P 29/024* (2013.01); *G01R 31/343* (2013.01); *G01R 31/52* (2020.01); *H02H 7/06* (2013.01)

(58) Field of Classification Search
CPC ..... G01R 31/52; G01R 31/343; H02P 29/024; H02H 7/06
See application file for complete search history.

(56) References Cited

U.S. PATENT DOCUMENTS 4,777,421 A * 10/1988 West .................... H02P 1/26
                                                363/148
9,362,735 B2 * 6/2016 Cypers .................. B60L 50/51
(Continued)

FOREIGN PATENT DOCUMENTS

CN  104655977 A  5/2015
CN  106709128 A  5/2017
(Continued)

OTHER PUBLICATIONS

PCT International Search Report and Written Opinion of International Searching Authority mailed Mar. 18, 2020 corresponding to PCT International Application No. PCT/EP2019/086822.
(Continued)

*Primary Examiner* — Lee E Rodak
*Assistant Examiner* — Demetrius R Pretlow
(74) *Attorney, Agent, or Firm* — Schmeiser, Olsen & Watts, LLP

(57) ABSTRACT

Provided is a method for determination of a location of a short circuit fault in a generator arrangement, wherein the generator arrangement includes an electrical machine and at least one channel, wherein the or each channel includes a breaker, a converter unit and a set of stator windings of the electrical machine connected to the converter unit via the breaker, wherein upon an occurrence of a short circuit in a
(Continued)

channel, the connection between the set of stator windings and the converter unit is interrupted by opening the breaker, wherein depending on at least one measured signal of a measurand, wherein the measured signal is measured by at least one sensor of the electric machine and wherein the measurand describes a torque ripple of the electrical machine, either the electrical machine or the converter unit of the channel is determined as location of the short circuit fault.

16 Claims, 3 Drawing Sheets

(51) Int. Cl.
*H02H 7/06* (2006.01)
*H02P 29/024* (2016.01)

(56) References Cited

U.S. PATENT DOCUMENTS

| | | | |
|---|---|---|---|
| 9,548,605 B2* | 1/2017 | Lewis | H02H 7/06 |
| 2011/0025369 A1* | 2/2011 | Quarto | G01R 31/343 |
| | | | 324/765.01 |
| 2011/0080676 A1* | 4/2011 | Yoshida | G01R 31/52 |
| | | | 361/30 |
| 2013/0033214 A1* | 2/2013 | Obata | G01R 31/1227 |
| | | | 324/765.01 |
| 2013/0211742 A1* | 8/2013 | Mol | G01L 1/06 |
| | | | 702/43 |
| 2013/0314013 A1* | 11/2013 | Ajima | B62D 5/0487 |
| | | | 318/400.21 |
| 2014/0049285 A1* | 2/2014 | Rodriguez | G01H 1/003 |
| | | | 324/765.01 |
| 2014/0152331 A1* | 6/2014 | Wagoner | G01R 27/16 |
| | | | 324/705 |
| 2014/0246999 A1* | 9/2014 | Kezobo | B60L 3/0061 |
| | | | 318/400.23 |
| 2014/0306583 A1* | 10/2014 | Moller | H02K 11/27 |
| | | | 310/68 C |
| 2014/0361784 A1* | 12/2014 | Satoh | G01R 31/52 |
| | | | 324/509 |
| 2015/0002187 A1* | 1/2015 | Schmidt | H02P 29/0241 |
| | | | 324/764.01 |
| 2015/0198655 A1 | 7/2015 | Viswanathan et al. | |
| 2016/0285251 A1* | 9/2016 | Urresty | H02H 7/06 |
| 2016/0372912 A1* | 12/2016 | Barker | F03D 7/0284 |
| 2016/0377670 A1* | 12/2016 | Tamida | G01R 31/34 |
| | | | 324/551 |
| 2017/0104437 A1* | 4/2017 | Suzuki | H02P 29/0241 |
| 2018/0259563 A1* | 9/2018 | Tsubota | H02H 3/14 |
| 2019/0267925 A1* | 8/2019 | Furukawa | H02P 29/024 |
| 2019/0372504 A1* | 12/2019 | Satou | H02P 29/024 |
| 2021/0203256 A1* | 7/2021 | Toyodome | F25B 31/026 |

FOREIGN PATENT DOCUMENTS

| | | |
|---|---|---|
| CN | 108832869 A | 11/2018 |
| CN | 108923723 A | 11/2018 |
| EP | 2 485 388 A1 | 8/2012 |
| EP | 3454469 A1 | 3/2019 |
| EP | 3522362 A1 | 8/2019 |
| EP | 3614556 A1 | 2/2020 |

OTHER PUBLICATIONS

Zhang Yan—Research on Electromagnetic Torque of Doubly-Fed Induction Generators with Stator Winding Inter-Turn Short Circuit; College of Energy and Electrical Engineering; China Academic Journal Electronic Publishing House 2017.

* cited by examiner

METHOD FOR DETERMINATION OF A LOCATION OF A SHORT CIRCUIT FAULT IN A GENERATOR ARRANGEMENT, GENERATOR ARRANGEMENT, WIND TURBINE, COMPUTER PROGRAM AND ELECTRONICALLY READABLE MEDIUM

CROSS-REFERENCE TO RELATED APPLICATIONS

This application claims priority to PCT Application No. PCT/EP2019/086822, having a filing date of Dec. 20, 2019, which is based on EP Application No. 18215481.5, having a filing date of Dec. 21, 2018, the entire contents both of which are hereby incorporated by reference.

FIELD OF TECHNOLOGY

The following relates to a method for determination of a location of a short circuit fault in a generator arrangement, wherein the generator arrangement comprises an electrical machine and at least one channel, wherein the or each channel comprises a breaker, a converter unit and a set of stator windings of the electrical machine connected to the converter unit via the breaker, wherein upon an occurrence of a short circuit in a channel, the connection between the set of stator windings and the converter unit is interrupted by opening the breaker. Furthermore, the following relates to a generator arrangement, a wind turbine, a computer program and an electronically readable medium.

BACKGROUND

In such a generator arrangement, short circuit faults can occur in different components of the arrangement. Generally, a short circuit fault causes a large current exceeding the current during proper operation of the generator arrangement. It is known to detect and to stop such a short circuit current in an electric circuit using fuses or circuit breakers. However, the large current appears independently of the location of the short circuit fault in the electric circuit of the generator arrangement. Hence, upon occurrence of a short circuit fault in a channel of the generator arrangement, only the faulty channel can be identified.

Therefore, it is desirable that upon occurrence of a short circuit fault in an electric circuit, detailed information on the short circuit fault can be obtained.

SUMMARY

An aspect relates to a method for determination of a location of a short circuit fault that gives more precise information on the location of the short circuit fault.

According to embodiments of the invention, this problem is solved by a method as initially described, wherein depending on at least one measured signal of a measurand, wherein the measured signal is measured by at least one sensor of the electric machine and wherein the measurand describes a torque ripple of the electrical machine, either the electrical machine or the converter unit of the channel is determined as location of the short circuit fault.

Upon occurrence of the short circuit fault in a channel of the electrical machine, not only can the faulty channel be detected by the opened breaker, but also a determination whether the short circuit fault occurred in the converter unit of the channel or in the electrical machine becomes possible by evaluating the measurand or the at least one measured signal of the measurand, respectively. Hence, different sources of the short circuit fault can be differentiated by evaluation of the measurand.

This has the advantage that after occurrence of the short circuit fault, a faulty component can be identified, facilitating a repair by providing the location of the faulty component which has to be repaired or replaced.

In an embodiment of the invention, the electrical machine comprises two or more channels, wherein after occurrence of the short circuit fault in a channel, the converter unit of the channel is stopped and the at least one breaker of the channel is opened, or the converter units of all channels are stopped and the breakers of all channels are opened. Opening the breaker stops the large short circuit current in the channel. It is in particular possible that the breaker comprises one breaker per phase of the channel or that a multi-phase breaker, for example a three-phase breaker for a three-phase channel, is used, so that each stator winding of the set of stator windings is separated from the converter unit.

In the case that only the converter unit of the faulty channel, in which the short circuit fault occurs, is stopped and the breaker of the faulty channel is opened, the remaining channels of the electrical machine can be used for stopping the electrical machine or the rotation of its rotor, respectively. It is also possible that all breakers in all channels of the electrical machine are opened and all converter units are stopped. In this case, a stopping of the rotation of the rotor of the electric machine can occur for instance using a mechanical brake or the like.

In an embodiment, the electrical machine comprises two or more channels, wherein after occurrence of the short circuit fault in a faulty channel of the channels, if the converter unit is determined as location, an operation of the generator arrangement is continued or restarted with the channel or the channels except the faulty channel, wherein, if the electrical machine is determined as location, the operation is stopped. A continuation of the operation of the electrical machine or a restarting of the operation of the generator arrangement in case of an occurrence of the short circuit fault in one converter unit of a channel enables a usage of the generator arrangement in the time period until the faulty converter unit can be repaired or replaced. In case of an occurrence of the short circuit fault in the electrical machine, a continuation of the operation of the generator arrangement is too dangerous, since the short circuit in the electrical machine may cause severe damage to the electrical machine or to the generator arrangement when the operation is continued, so that in this case the operation is stopped and a restarting of the operation of the generator arrangement can be prevented.

In a generator arrangement with an electrical machine that comprises more than one channel, only the faulty channel may remain disconnected if the converter unit of the faulty channel caused has been determined as location of the short circuit fault. Other channels of the electrical machine that comprise converter units which are still working properly can be used to continue the operation of the generator arrangement. In this case, it is possible to continue the operation of the generator arrangement and to prevent a shut-down of the entire generator arrangement.

However, in the case that the short circuit fault occurs in the electrical machine of the generator arrangement, a further operation of the entire generator arrangement should not occur, since the short circuit fault in the electrical machine may cause damage to the electrical machine or to other components of the generator arrangement, respectively.

Consequently, if the electrical machine is determined as location of the short circuit fault, a further operation of the generator arrangement can be prevented.

Having the ability to continue the operation of a generator arrangement comprising more than one channel is in particular advantageous for a generator arrangement which is a part of facilities generating electrical energy like wind turbines or the like. In this case, a short circuit fault in a converter unit of one channel does not cause a stopping of the entire facility until the faulty component is repaired.

The electrical machine can be in particular an electrical machine with a multi-phase stator, which comprises several sets of stator windings each connected to a separate converter unit. The set of stator windings or the sets of stator windings can be three-phased stator windings generating a three-phase electrical current in the stator during a rotation of a rotor or operation of the electrical machine as generator, respectively. In particular, the rotor can comprise permanent magnets or rotor coils, which generate a magnetic field also after occurrence of the short circuit fault.

Due to a magnetic coupling between the rotating rotor and the stator of the electrical machine, after occurrence of a short circuit fault, a torque ripple in the torque of the electrical machine can occur. This torque ripple is measured by the at least one sensor of the electrical machine, wherein the sensor quantifies at least one measurand, which describes the torque ripple of the electrical machine. As measurand, a physical quantity, which is influenced by the torque ripple of the electrical machine, can be used. The measurand can for instance exhibit a ripple corresponding to and/or proportional to the torque ripple of the electrical machine.

The torque ripple of the electrical machine is different for short circuits, depending on whether they appear in the converter unit or in the generator. Hence, by evaluation of the torque ripple of the electrical machine, a determination of the location of the short circuit fault becomes possible.

Upon occurrence of a short circuit of the channel, the connection between the set of stator windings and the converter unit is interrupted by opening of the breaker. The breaker may comprise for instance a switch coupled to a current sensor. In an embodiment, the breaker is a circuit breaker, which interrupts the connection between the converter unit and the set of stator windings when a short circuit or a large short circuit current appears. In an embodiment, also the converter unit is stopped upon occurrence of the short circuit, for instance by switching it off or by stopping its operation, respectively.

However, the short circuit fault may have occurred either in the converter unit or in the generator. The short circuit fault in the converter unit can occur, for instance, due to faulty components in the converter. A short circuit fault in the generator can occur for instance due to an insulation breakdown inside the electrical machine. However, the connection between the converter unit and the set of stator windings is interrupted independently of the location of the short circuit for stopping the large short circuit current.

After interrupting the connection between the converter unit and the set of stator windings, the high short circuit current flow between converter and machine in the faulty channel stops. Despite the short circuit fault, before opening the breaker, the behaviour of the generator arrangement does not depend on the location of the short circuit fault. However, after interrupting the connection between the converter unit and the set of stator windings, the rotor of the electrical machine is still rotating and the behaviour of the generator arrangement differs depending on the location of the short circuit fault.

If the short circuit fault is caused by a fault inside the converter unit, the current in the channel will go down to zero, since the switching of the converter unit is stopped and the connection between the converter unit and the set of stator windings is interrupted. If the short circuit fault is caused by an internal fault in the electrical machine, even after interruption of the connection between the converter unit and the set of stator windings the magnetic coupling by the electromotive force (back-EMF) in the windings of the electrical machine would generate a fault current in the electrical machine until the rotation of the rotor is stopped. Upon occurrence of a short circuit fault in a set of stator windings, even after opening of the breaker, a closed loop remains due to the short circuit. In this closed loop, a fault current is induced by the rotating rotor of the electrical machine. However, such a fault current cannot be measured directly. Embodiments of the invention are based on the idea to measure such a fault current indirectly by evaluating a measured signal of a measurand, which describes a torque ripple of the electrical machine, since the presence of a fault current influences the torque ripple of the electrical machine. Consequently, by evaluating the at least one measured signal of the measurand related to the torque ripple of the electrical machine, a determination of a location of the short circuit becomes possible.

In an embodiment, as the at least one sensor of the electrical machine, a sensor measuring a vibration and/or an acceleration of at least one component of the electrical machine is used. By a sensor measuring the vibration of at least one component of the electrical machine, the measurand can be, for instance, a periodic displacement of the at least one component of the electrical machine. The displacement can correspond to the torque ripple, since a larger torque ripple of the electrical machine may cause a larger vibration of the at least one component of the electrical machine. Additionally or alternatively, it is possible that a sensor, which measures an acceleration of at least one component of the electrical machine, is used, wherein correspondingly a larger torque ripple of the electrical machine may cause a larger acceleration ripple amplitude of at least one component of the electrical machine.

In an embodiment of the invention, an accelerometer coupled to a main bearing of the electrical machine and/or to at least one stator plate of the electrical machine is used as sensor and/or a microphone measuring sound inside the electrical machine is used as sensor and/or a short circuit torque controller is used as sensor. The main bearing can be arranged between the rotor and the stator of the electrical machine to support the rotating rotor against the stator, so that a torque ripple of the electrical machine causes a vibration or a periodic deflection of the main bearing or component of the main bearing, which can be measured by an accelerometer coupled to the main bearing. A sensor can be coupled, for instance, to a stationary ring of the main bearing. It is possible that a sensor provided for monitoring a bearing condition is used.

It is also possible that an accelerometer coupled to a stator plate is used. The stator plate is an annular flat plate which delimits the stator towards the environment and which can vibrate and/or exhibit a displacement depending on a torque ripple of the electrical machine.

Additionally or alternatively, a microphone measuring sound inside the electrical machine can be used as a sensor since the appearance of a torque ripple in the electrical machine may cause the generation of sound into the air and/or as a mechanical vibration inside the electrical machine. It is also possible that a short circuit torque controller is used as a sensor, wherein the short circuit torque controller can be configured to reduce the appearance of torque ripple during the occurrence of a short circuit in the electrical machine to minimize noise generation and to prevent damage to the electrical machine in case of a short circuit fault. Such a short circuit torque controller comprises a sensor which measures a measurand describing a torque ripple of the electrical machine to apply counter measures reducing the torque ripple. Advantageously, the measurand measured by the short circuit torque controller can be used also for the determination of the location of the short circuit.

In an embodiment, a comparison value related to an amplitude of the torque ripple is derived from the at least one measured signal of the measurand, wherein the comparison value is compared to a threshold value, wherein the electrical machine is determined as location of the short circuit fault if the comparison value is above the threshold value, and the converter unit is determined as location of the short circuit fault if the comparison value is below the threshold value. The comparison value can be derived from one or more measured signals of the measurand, wherein the at least one measured signal can comprise in particular a measurement over a short period of time to describe the effect of the torque ripple on the measurand. From this at least one measured signal, a comparison value is derived and compared to a threshold value. A larger comparison value corresponds to a larger torque ripple, which appears as described above in case of a short circuit fault in the electrical machine. Hence, a comparison value above the threshold indicates a short circuit in the electrical machine and a comparison value below the threshold value indicates a short circuit in the converter unit. The threshold value, which is used for the comparison to the comparison value, can be a constant or a variable and it can be derived from measurements or it can be determined empirically. The threshold value can depend in particular on the type of the electrical machine and/or the type of the generator arrangement or facility in which the generator arrangement is used.

In an embodiment, a root-mean-square value of the value or a peak-to-peak value of the measured signal is used as comparison value or an absolute value of the measured signal is used. A root-mean-square value and/or a peak-to-peak-value can be used to describe an amplitude of a periodic signal or a periodic component of the measured signal of the measurand corresponding to the torque ripple of the electric machine, respectively. Due to the rotation of the rotor, also the torque ripple can exhibit a periodicity, in particular corresponding to the rotational speed of the rotor. As absolute value, for instance, a maximum value or an average value within an averaging period of the measured signal can be used.

In an embodiment of the invention, the threshold value is determined depending on an average torque of the electrical machine and/or a rotational speed of the electrical machine. A determination of the threshold value depending on an average torque of the electrical machine can account for the fact that a larger operating torque of the electrical machine may cause a larger torque ripple in the case of a short circuit fault. An average torque after opening of the breakers can be used in particular in a multi-channel generator comprising two or more sets of stator windings. Since the amplitude of the torque ripple may depend on the frequency of rotation as well, also a dependence of the threshold value on a rotational speed of the electrical machine can be advantageous. The rotational speed of the electrical machine and/or the average torque of the electrical machine can be determined for instance by a torque sensor and/or an rotation sensor of the electric machine and/or a speed observer unit implemented in the operating channels of a multi-channel machine, in particular when the short circuit fault occurs or in a time interval shortly after the occurrence of the short circuit fault, respectively, so that the present state of the machine can be considered for the determination of the location of the short circuit fault.

In particular, the implementation of the described method is feasible in a wind turbine even though a stop of the wind turbine operation is triggered upon occurrence of the short circuit, since short-circuit detection and breaker opening are typically accomplished in the ms range (below 300 ms), whereas the turbine stop takes several seconds (above 10 s). Accordingly, a sufficient time window between breaker opening and turbine stop is available for fault discrimination.

In an embodiment, the at least one measured signal of the measurand is bandpass filtered, wherein the lower cutoff frequency and/or the upper cutoff frequency of the bandpass filtering are determined in dependence of a rotational speed of the electrical machine. By bandpass filtering of a measured signal of the measurand, a certain frequency or a certain frequency band corresponding to the passband of the bandpass filter can be extracted for evaluation of the measurand. By determining the lower cutoff frequency and/or the upper cutoff frequency of the bandpass filtering, it becomes possible to filter the measured signal, so that a measured signal, which corresponds to a certain harmonic of a torque ripple can be obtained. It is for instance possible that a torque ripple at a frequency, which is twice the frequency of the rotation of the electrical machine, is extracted. Also other harmonics, like a fourth harmonic or a sixth harmonic, can be extracted using the bandpass filtering and the determination of the lower cutoff frequency and the upper cutoff frequency depending on a rotational speed of the electrical machine. Choosing different harmonics of the torque ripple may account for different geometries and/or features of electrical machines and can depend on the type of the electrical machine which is used in the generator arrangement.

A generator arrangement according to embodiments of the invention comprises an electrical machine, a control unit and at least one channel, wherein the or each channel comprises a breaker, a converter unit and a set of stator windings of the electrical machine connected to the converter unit via the breaker, wherein the electrical machine comprises at least one sensor that measures a measurand describing a torque ripple of the electrical machine, wherein the control unit is configured to perform a method according to embodiments of the invention.

In an embodiment, the electrical machine can comprise two or more channels, which can be, for instance, three-phase channels comprising each a three-phase set of stator windings. The control unit can be connected to the converter unit and/or to the breaker. The control unit is connected to the at least one sensor that measures the measurand. Furthermore, the control unit can be connected to further sensors of the electrical machine, wherein the further sensors measure, for instance, an average torque of the electrical machine and/or a rotational speed of the electrical machine. Additionally or alternatively, it is possible that an average torque of the electrical machine and/or a rotational speed of the electrical machine are calculated and/or estimated by the control unit, for instance by evaluating currents and/or voltages of the electrical machine.

A wind turbine according to embodiments of the invention comprises a generator arrangement according to embodiments of the invention.

A computer program according to embodiments of the invention comprises instructions which, when the program is executed by a control unit of a generator arrangement comprising an electrical machine, a control unit and at least one channel, wherein the or each channel comprises a means or a detector for detecting an occurrence of a short circuit in the channel, a converter unit and a set of stator windings of the electrical machine connected to the converter unit, wherein the electrical machine comprises at least one sensor that measures a measurand describing a torque ripple of the electrical machine, causes the control unit to carry out a method according to embodiments of the invention.

An electronically readable medium according to embodiments of the invention has a computer program according to embodiments of the invention stored thereon.

All features and advantages described in relation to the method according to embodiments of the invention apply correspondingly for the generator arrangement according embodiments of the invention, the wind turbine according to embodiments of the invention, the computer program according to embodiments of the invention and the electronical readable medium according to embodiments of the invention.

BRIEF DESCRIPTION

Some of the embodiments will be described in detail, with reference to the following figures, wherein like designations denote like members, wherein.

DETAILED DESCRIPTION

Figure 1:
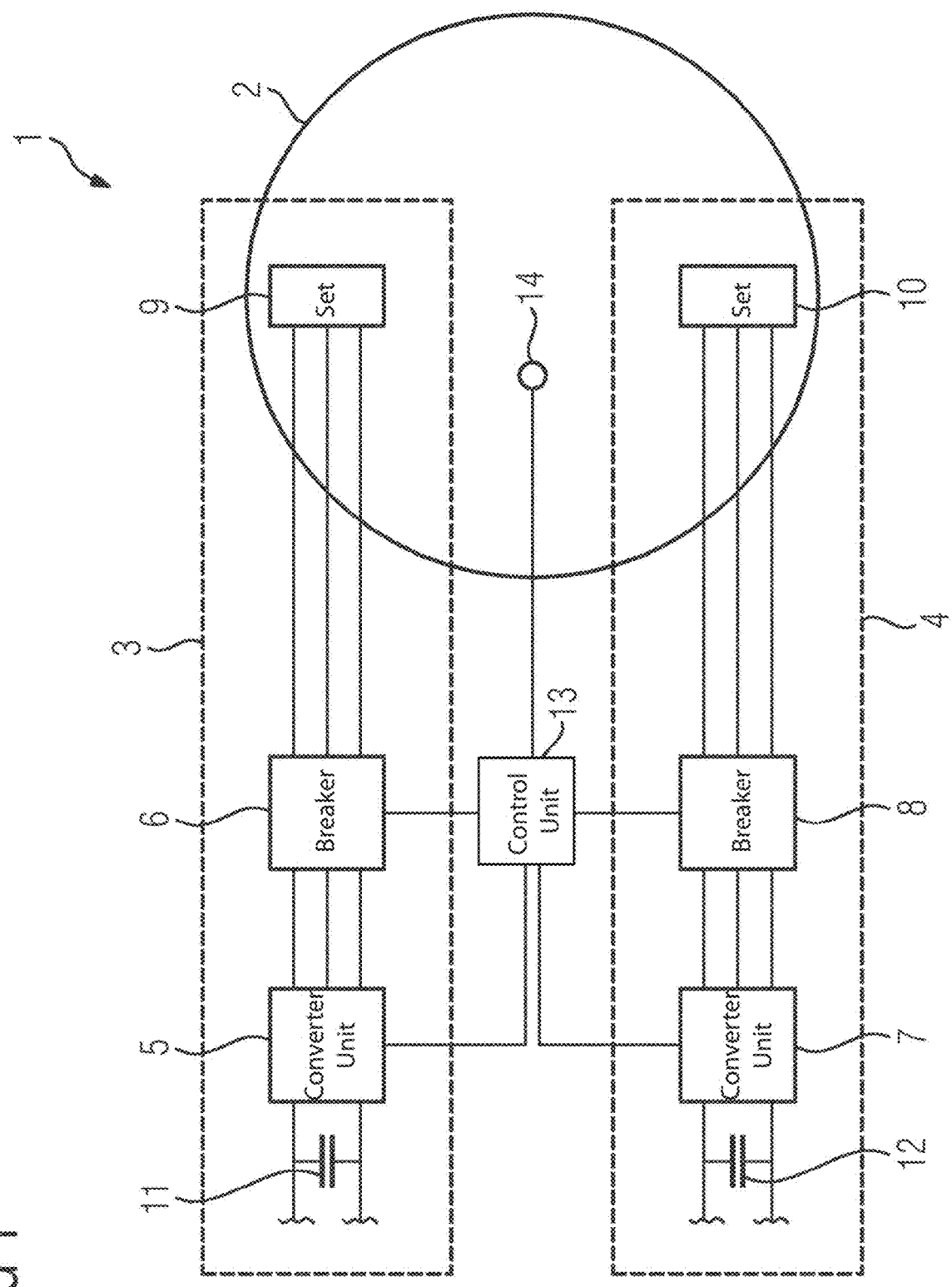
FIG. 1 depicts a generator arrangement according to embodiments of the invention.

In FIG. 1, a generator arrangement 1 according to embodiments of the invention is shown. The generator arrangement 1 comprises an electrical machine 2, a first channel 3 and a second channel 4. The first channel 3 comprises a converter unit 5 and a breaker 6. Correspondingly, the second channel 4 comprises a converter unit 7 as well as a breaker 8.

The converter unit 5 of the first channel 3 is connected to a set 9 of stator windings of the electrical machine 2 via the breaker 6. Correspondingly, the second channel 4 comprises a set 10 of stator windings, which is connected to the control unit 7 via the breaker 8. The sets 9, 10 of stator windings are three-phase sets of stator windings. During rotation of the electrical machine 2, hence during a generator operation of the electrical machine 2, a three-phase electrical current is generated in each of the channels 3, 4. The generated three-phase electrical current is converted by the converter units 5, 7 into a DC current. The DC-side of the converter units 5, 7 can be connected to other electrical components and/or electrical circuits and/or a power grid. In this embodiment, on the DC-side of the converters 5, 7 of each channel 3, 4, a capacitor 11, 12 is arranged for frequency filtering. However, further components on the DC-side are omitted in FIG. 1. It is in particular possible that the generator arrangement 1 is used in a power generating device, for instance in a wind turbine.

The breaker 6 in the first channel 3 can be opened to interrupt the connection between the converter unit 5 and the set 9 of stator windings in case of a short circuit in the first channel 3. Correspondingly, the breaker 8 in the second channel 4 can be opened to interrupt the connection between the converter unit 7 and the set 10 of stator windings in case of a short circuit in the second channel 4. In an embodiment, the breakers 6 and 8 may interrupt simultaneously their respective connections in case of a short circuit in one of the channels 3, 4.

The generator arrangement 1 comprises further a control unit 13 which is connected to the converter units 5, 7 and the breakers 6, 8. Furthermore, the control unit 13 is connected to a sensor 14 of the electrical machine 2, wherein the sensor 14 measures a measurand describing a torque ripple of the electrical machine 2. The control unit 13 comprises a memory unit for storing of data and/or programs, a communication unit for sending and receiving data and a processor unit for processing the data and/or for executing the programs and/or for controlling the communication unit.

In this embodiment, the sensor 14 is an accelerometer coupled to a main bearing of the electrical machine 2. By the sensor 14, a vibration caused by the appearance of torque ripple in the electrical machine 2 can be measured, since the vibration measurable by the sensor 14 in the main bearing corresponds to a torque ripple of the electrical machine 2. Additionally or alternatively, also an accelerometer coupled to at least one stator plate of the electrical machine 2 and/or a microphone measuring sound inside the electrical machine 2 and/or a short circuit torque controller can be used as sensor 14.

If a short circuit appears, for instance, in the first channel 3, the breaker 6 is opened to stop the short circuit current in the first channel 3. The opening of the breaker 6 can be detected and/or commanded for instance by the control unit 13. An operation of the converter unit 5 can be stopped by the control unit 13. The short circuit in channel 3 can occur in the converter unit 5, for instance due to a faulty component in the converter unit 5. It is also possible that the short circuit fault appears in the electrical machine 2, for instance due to an insulation breakdown inside the electrical machine 2 and/or in the set 9 of stator windings. Depending on the location in which the short circuit fault occurs, a different behaviour regarding a torque ripple of the electrical machine 2 occurs. Since the electrical machine 2 is in operation when the short circuit fault occurs, a rotor of the electrical machine 2 is rotating. The rotor comprises a means for generating of a magnetic field, for instance a plurality of permanent magnets, so that after the occurrence of the short circuit fault in the electrical machine 2, a current can be generated in the electrical machine 2 due to the magnetisation of the rotor. In this case, a fault current is flowing in the set 9 of stator windings.

In the case that the short circuit fault appears in the converter unit 5, no fault current is generated since the connection between the converter unit 5 and/or the stator windings of the set 9 of stator windings is disrupted by opening the breaker 6, and the switching in converter unit 5 is stopped.

The fault current in the electrical machine 2 causes a torque ripple of the torque of the electrical machine 2. Since the fault current in the electrical machine 2 cannot be measured directly, a measurement of the torque ripple can be used as an indirect measurement of the fault current. The torque ripple can be for instance measured by the sensor 14, which measures a vibration in the main bearing of the electrical machine 2, since, if a torque ripple appears or increases in the torque of the electrical machine 2, also a vibration of the main bearing of the electrical machine 2 can appear or increase, respectively.

Figure 2:
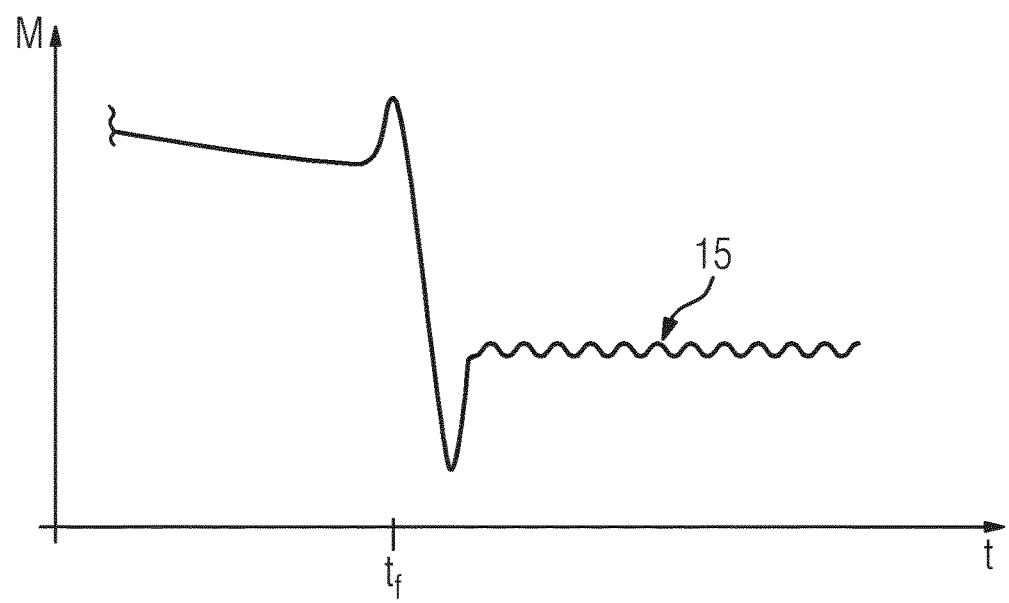
FIG. 2 depicts a diagram depicting the torque of an electrical machine in case of a short circuit fault in a converter unit.

In FIG. 2, a graph depicting the torque of the electrical machine 2 is shown. On the ordinate, the torque M is plotted, depending on the time t which is plotted on the abscissa. At the time $t_f$, a short circuit fault occurs in channel 3 of the generator arrangement 1. After a few initial peaks, a torque ripple is set up as discernible in the portion 15 of the curve. The curve in FIG. 2 depicts the torque of the electrical machine 2 in case of a short circuit fault in the converter unit 5 of channel 3. The average torque after the occurrence of the short-circuit fault is reduced to approximately half of the value prior to the fault.

Figure 3:
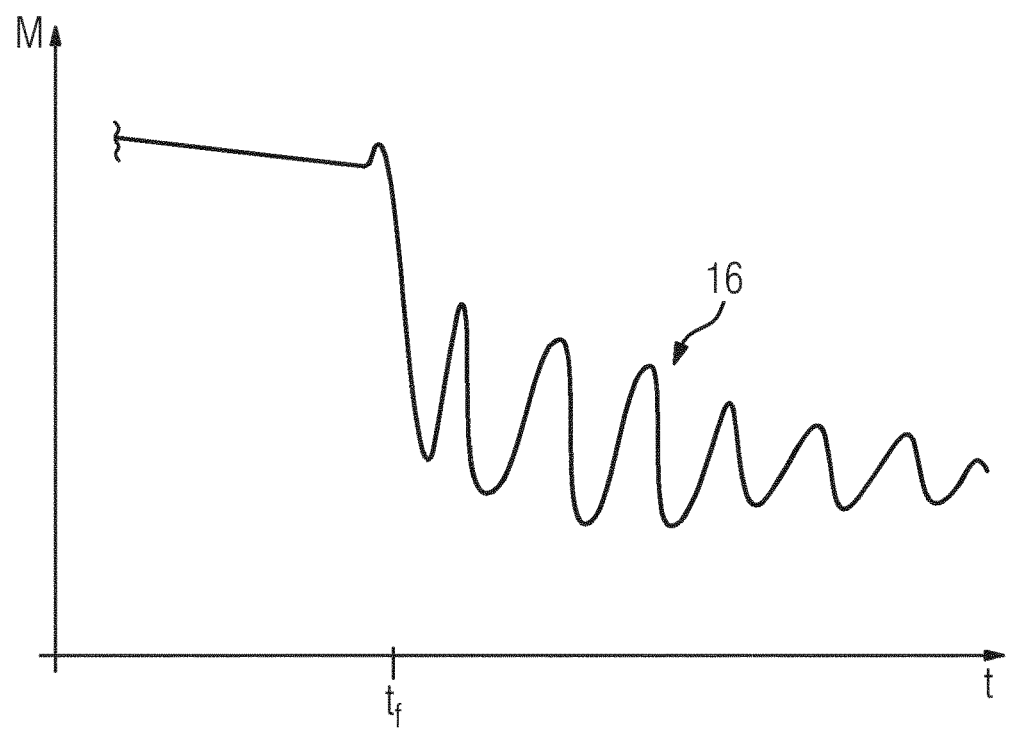
FIG. 3 depicts a diagram depicting the torque of an electrical machine in case of a short circuit fault in the electrical machine.

In FIG. 3, the curve of the torque M of the electrical machine 2 for the occurrence of a short circuit fault in the electrical machine 2 is depicted. The short circuit fault appears correspondingly at $t_f$. However, in case of the occurrence of the short circuit fault in the electrical machine 2, the amplitude of the torque ripple in the portion 16 of the curve exhibits a larger amplitude than in the case of the occurrence of the short circuit fault in the converter unit 5 as depicted in FIG. 2. Due to the different amplitude of the torque ripple of the torque of the electrical machine 2, a differentiation between the electrical machine 2 and the converter unit 5 of the first channel 3 as location of the short circuit fault is possible.

Figure 4:
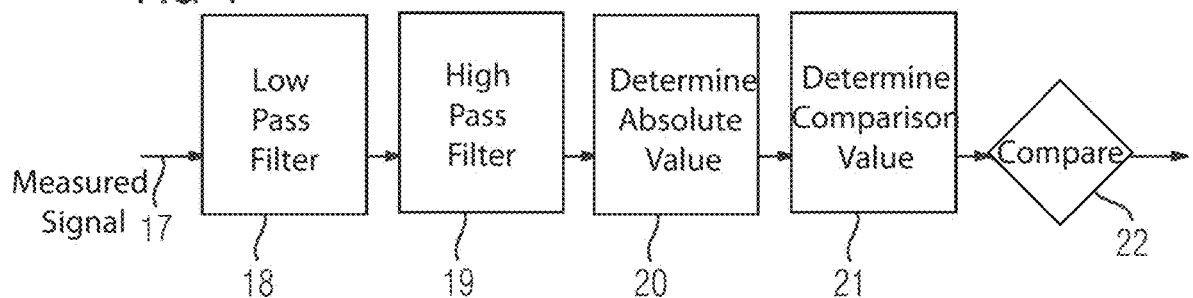
FIG. 4 depicts a block diagram of a first embodiment of a method according to embodiments of the invention.

In FIG. 4 a block diagram of a first embodiment of a method according to the invention is shown. As input variable, a measured signal 17 of a measurand, which describes the torque ripple of the electric machine 2, is used. The measured signal 17 can be measured by the sensor 14 of the electrical machine 2. The measurand can be, for instance, an acceleration measured by the sensor 14 at a stationary ring of a main bearing of the electrical machine 2.

In block 18, a low pass filtering eliminating a DC bias of the measured signal 17 occurs. After the low pass filtering, the measured signal 17 is high pass filtered in block 19 to remove any HF noise. From the filtered measured signal 17, an absolute value of a ripple in the measured signal 17 corresponding to an absolute value of the torque ripple amplitude is determined in block 20. In block 21, after determination of an absolute value of the ripple in the measured signal 17, a comparison value is determined by averaging the obtained absolute value over a certain interval of time or over an averaging window, respectively. The comparison value is related to an amplitude of the torque ripple or an amplitude of a ripple in the measured signal 17 corresponding to the torque ripple, respectively.

In block 22, the comparison value is compared to a threshold value, wherein the threshold value can be a fixed value or can be determined depending on an absolute torque or an average torque of the electrical machine 2. The absolute or average torque of the electrical machine 2 can be measured by a torque sensor connected to the control unit 13 or it can be calculated and/or estimated by control unit 13 based on currents and/or voltages in the electrical machine 2 measured and/or controlled by the control unit 13. If the comparison value exceeds the threshold value, the electrical machine 2 is chosen as location of the short circuit fault. Contrary, if the comparison value is below or equal to the threshold value, the converter unit 4 of the first channel 3 is determined as location of the short circuit fault. The functionality of the blocks 18 to 22 can be implemented in the control unit 13 of the generator arrangement 1.

Figure 5:
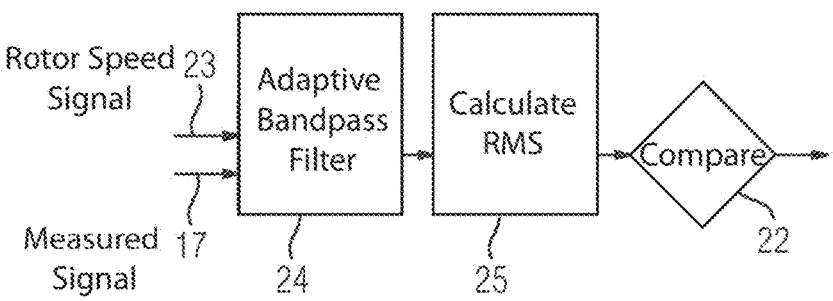
FIG. 5 depicts a block diagram of a second embodiment of a method according to embodiments of the invention.

In FIG. 5, a second embodiment of a method according to the invention is depicted. The method can be conducted by the control unit 13 of the generator arrangement 1. As input variables, again the measured signal 17 measured by the sensor 14 is used. Additionally, a rotor speed signal 23, which is measured by a rotor speed sensor of the electrical machine 2 (not shown) or which is calculated and/or estimated by the control unit 13, is used. In block 24, an adaptive bandpass filtering of the measured signal 17 occurs. Thereby, a lower cutoff frequency and/or an upper cutoff frequency of the bandpass filtering can be adjusted depending on the rotor speed signal 23. By adjusting the lower cutoff frequency and/or the upper cutoff frequency of the bandpass filtering, a certain harmonic of the rotation of the rotor can be filtered from the measured signal. It is for instance possible that a second harmonic of the measured signal 17 is filtered. It is also possible that depending on a type of the electrical machine 2, a fourth harmonic or a sixth harmonic of the measured signal 17 is filtered. Additionally or alternatively, also a centre frequency and/or a damping of the bandpass filtering can be adjusted.

In block 25, a root-mean-square is calculated from the measured signal 17 as a comparison value. Additionally or alternatively, a root-mean-square value, also the calculation of a peak-to-peak value of the measured signal 17 is possible. The comparison value can be determined depending on the rotor speed signal 23. The determined comparison value corresponds to the torque ripple of the electrical machine 2. The comparison value determined in block 25 is compared to a threshold value in block 22 as described for the first embodiment of the method. It is possible that the threshold value used for the comparison in block 22 is determined depending on an average torque of the electrical machine 2 and/or depending on the rotor speed signal 23. The second embodiment of the method can also be implemented in the control unit 13.

In both embodiments of the method discussed in the foregoing, it is possible that, after the determination of the location of the short circuit fault, if the converter unit 5 has been determined as location of the short circuit fault, a restarting of the generator arrangement 1 using the second channel 4 is performed, in particular if the breaker 8 was opened upon occurrence of the short circuit fault. It is also possible that in the case that only the breaker 6 of the first channel 3 has opened, an operation of the generator arrangement 1 is continued using the second channel 4. However, if the electrical machine 2 has been determined as location of the short circuit fault, the operation of the generator arrangement 1 is stopped.

The method is conducted correspondingly if the fault occurs in the second channel 4 instead of the first channel 3. In the case of an electrical machine comprising only one channel, the location of the short circuit fault can be, for instance, stored in a storage the control unit 13, so that prior to a repair of the generator arrangement 1, the localisation of the short circuit can be used to facilitate the repair.

If the method is applied in a generator arrangement comprising more than two channels, the operation can be continued using all channels except the faulty channel if the converter unit of the faulty channel was determined as location of the short circuit fault. Correspondingly, if the electrical machine 2 has been determined as location of the short circuit fault, the operation of all channels of the generator arrangement 1 is prevented or stopped.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for determination of a location of a short circuit fault in a generator arrangement, wherein the generator arrangement comprises an electrical machine and at least one channel, wherein the or each channel includes a breaker, a converter unit and a set of stator windings of the electrical machine connected to the converter unit via the breaker, wherein upon an occurrence of a short circuit in a channel, the connection between the set of stator windings and the converter unit is interrupted by opening the breaker, characterized in that depending on at least one measured signal of a measurand, wherein the measured signal is measured by at least one sensor of the electrical machine, wherein as the at least one sensor of the electric machine, a sensor measuring a vibration and/or an acceleration of at least one component of the electrical machine is used, wherein an accelerometer coupled to a main bearing of the electrical machine and/or to at least one stator plate of the electrical machine is used as the sensor and/or that a microphone measuring sound inside the electrical machine is used as the sensor and/or that a short circuit torque controller is used as the sensor, and wherein the measurand describes a torque ripple of the electrical machine, either the electrical machine or the converter unit of the channel is determined as location of the short circuit fault by evaluation of the torque ripple of the electrical machine.

2. The method according to claim 1, wherein a comparison value related to an amplitude of the torque ripple is derived from the at least one measured signal of the measurand, wherein the comparison value is compared to a threshold value, wherein the electrical machine is determined as location of the short circuit fault if the comparison value is above the threshold value and the converter unit is determined as location of the short circuit fault if the comparison value is below the threshold value.

3. The method according to claim 2, wherein a root-mean-square value of the measured signal or a peak-to-peak value of the measured signal or an absolute value of the measured signal is used as comparison value.

4. The method according to claim 2, wherein the threshold value is determined depending on an average torque of the electrical machine and/or a rotational speed of the electrical machine.

5. The method according to claim 1, wherein the at least one measured signal of the measurand is bandpass filtered, wherein the lower cutoff frequency and/or the upper cutoff frequency of the bandpass filtering are determined in dependence of a rotational speed of the electrical machine.

6. The method according to claim 1, wherein the electrical machine comprises two or more channels, wherein after occurrence of the short circuit fault in a channel, the converter unit of the channel is stopped and the at least one breaker of the channel is opened, or the converter units of all channels are stopped and the breakers of all channels are opened.

7. The method according to claim 1, wherein the electrical machine comprises two or more channels, wherein after occurrence of the short circuit fault in a faulty channel of the channels, if the converter unit is determined as location, an operation of the generator arrangement is continued or restarted with the channel or the channels except the faulty channel, wherein if the electrical machine is determined as location the operation is stopped.

8. A generator arrangement comprising an electrical machine, a control unit, and at least one channel, wherein the or each channel comprises a breaker, a means for detecting or detector for an occurrence of a short circuit in the channel, a converter unit, and a set of stator windings of the electrical machine connected to the converter unit via the breaker, wherein upon the occurrence of the short circuit in the channel, the connection between the set of stator windings and the converter unit is interrupted by opening the breaker, wherein the electrical machine includes at least one sensor that measures a vibration and/or an acceleration of at least one component of the electrical machine, wherein an accelerometer coupled to a main bearing of the electrical machine and/or to at least one stator plate of the electrical machine is used as the at least one sensor and/or a microphone measuring sound inside the electrical machine is used as the at least one sensor and/or a short circuit torque controller is used as the at least one sensor, wherein the sensor measures a measurand describing a torque ripple of the electrical machine, wherein the control unit is configured to determine either the electrical machine or the converter unit of the channel as a location of a short circuit fault by evaluation of the torque ripple of the electrical machine.

9. A wind turbine comprising the generator arrangement according to claim 8.

10. A computer program product, comprising a non-transitory computer readable hardware storage device having computer readable program code stored therein, said program code executable by a processor of a computer system to implement the method of claim 1 when the program code is executed by a control unit of the generator arrangement comprising the electrical machine, the control unit and at the least one channel.

11. A computer program product, comprising a non-transitory computer readable hardware storage device having computer readable program code stored therein, said program code executable by a processor of a computer system to implement the method of claim 1.

12. The generator arrangement according to claim 8, wherein either the electrical machine or the converter unit of the channel is determined as location of the short circuit fault by evaluation of the torque ripple of the electrical machine, wherein a physical quality, which is influenced by the torque ripple of the electrical machine, is used as the measurand.

13. The method according to claim 1, wherein either the electrical machine or the converter unit of the channel is determined as location of the short circuit fault by evaluation of the torque ripple of the electrical machine, wherein a physical quality, which is influenced by the torque ripple of the electrical machine, is used as the measurand.

14. A method for determination of a location of a short circuit fault in a generator arrangement, wherein the generator arrangement comprises an electrical machine and at least one channel, wherein the or each channel includes a breaker, a converter unit and a set of stator windings of the electrical machine connected to the converter unit via the breaker, wherein upon an occurrence of a short circuit in a channel, the connection between the set of stator windings and the converter unit is interrupted by opening the breaker, characterized in that depending on at least one measured signal of a measurand, wherein the measured signal is measured by at least one sensor of the electrical machine and wherein the measurand describes a torque ripple of the electrical machine, either the electrical machine or the converter unit of the channel is determined as location of the short circuit fault by evaluation of the torque ripple of the electrical machine, wherein a comparison value related to an amplitude of the torque ripple is derived from the at least one measured signal of the measurand, wherein the comparison value is compared to a threshold value, wherein the electrical machine is determined as location of the short circuit fault if the comparison value is above the threshold value and the converter unit is determined as location of the short circuit fault if the comparison value is below the threshold value.

15. The method according to claim 14, wherein a root-mean-square value of the measured signal or a peak-to-peak value of the measured signal or an absolute value of the measured signal is used as comparison value.

16. The method according to claim 14, wherein the threshold value is determined depending on an average torque of the electrical machine and/or a rotational speed of the electrical machine.

* * * * *